(12) United States Patent
Choi et al.

(10) Patent No.: US 8,472,544 B2
(45) Date of Patent: *Jun. 25, 2013

(54) DIGITAL TELEVISION TRANSMITTER AND METHOD OF CODING DATA IN DIGITAL TELEVISION TRANSMITTER

(75) Inventors: In Hwan Choi, Gyeonggi-do (KR); Kyung Won Kang, Seoul (KR); Kook Yeon Kwak, Gyeonggi-do (KR); Young Jin Hong, Seoul (KR); Sung Ryong Hong, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 360 days.

This patent is subject to a terminal disclaimer.

(21) Appl. No.: 12/860,072

(22) Filed: Aug. 20, 2010

(65) Prior Publication Data

US 2010/0316138 A1    Dec. 16, 2010

Related U.S. Application Data

(63) Continuation of application No. 11/456,774, filed on Jul. 11, 2006, now Pat. No. 7,804,909.

(30) Foreign Application Priority Data

Sep. 27, 2005    (KR) .................. 10-2005-0090175

(51) Int. Cl.
*H04L 5/12*    (2006.01)
*H04L 23/02*    (2006.01)

(52) U.S. Cl.
USPC ........... 375/265; 375/321; 375/270; 375/277; 375/301

(58) Field of Classification Search
USPC .......................... 375/265, 321, 270, 277, 301
See application file for complete search history.

(56) References Cited

U.S. PATENT DOCUMENTS

| | | | |
|---|---|---|---|
| 6,530,060 | B1 | 3/2003 | Vis et al. |
| 6,806,915 | B2 | 10/2004 | Koo |

(Continued)

FOREIGN PATENT DOCUMENTS

| | | |
|---|---|---|
| CN | 1334655 | 2/2002 |
| CN | 1582580 | 2/2005 |

(Continued)

OTHER PUBLICATIONS

"MS13544 Reed-Solomon and Convolutional Encoder (RESCUE)," Preliminary Information, Mitel Semiconductor, Dec. 1998.*

*Primary Examiner* — Shuwang Liu
*Assistant Examiner* — Nader Bolourchi
(74) *Attorney, Agent, or Firm* — Lee, Hong, Degerman, Kang & Waimey

(57) ABSTRACT

A digital television (DTV) transmitter and a method of coding data in the DTV transmitter method are disclosed. A pre-processes enhanced data by coding the enhanced data for forward error correction (FEC) and expanding the FEC-coded enhanced data. A data formatter generates enhanced data packets including the pre-processed enhanced data and inserting known data to at least one of the enhanced data packets. A first multiplexer multiplexes main data packets with the enhanced data packets, and a data randomizer randomizes the multiplexed data packets. A Reed-Solomon (RS) encoder RS-codes the randomized data packets by adding first parity data, and a data interleaver interleaves the RS-coded data packets. A trellis encoder trellis-encodes the interleaved data packets, wherein the trellis encoder may be initialized when a known data sequence is inputted thereto.

8 Claims, 11 Drawing Sheets

U.S. PATENT DOCUMENTS

| | | |
|---|---|---|
| 6,924,847 B2 | 8/2005 | Choi et al. |
| 2002/0186790 A1 | 12/2002 | Choi et al. |
| 2004/0179616 A1 | 9/2004 | Choi et al. |
| 2006/0253890 A9 | 11/2006 | Park et al. |
| 2007/0033475 A1 | 2/2007 | Park et al. |
| 2007/0091885 A1 | 4/2007 | Yu et al. |
| 2007/0253502 A1 | 11/2007 | Park et al. |

FOREIGN PATENT DOCUMENTS

| | | |
|---|---|---|
| KR | 1020010111667 | 12/2001 |
| KR | 10-2002-0062076 | 7/2002 |
| KR | 10-2003-0026236 | 3/2003 |
| KR | 1020050077255 | 8/2005 |
| KR | 10-0813040 | 3/2008 |
| MX | PA03005163 | 9/2003 |
| MX | PA04002568 | 12/2004 |

* cited by examiner

DIGITAL TELEVISION TRANSMITTER AND METHOD OF CODING DATA IN DIGITAL TELEVISION TRANSMITTER

CROSS-REFERENCE TO RELATED APPLICATIONS

This application is a continuation of U.S. application Ser. No. 11/456,774 filed on Jul. 11, 2006, now U.S. Pat. No. 7,804,909, which claims the benefit of earlier filing date and right of priority to the Korean Patent Application No. 10-2005-0090175, filed on Sep. 27, 2005, the contents of which are hereby incorporated by reference as if fully set forth herein.

BACKGROUND OF THE INVENTION

1. Field of the Invention

The present invention relates to a digital telecommunications system, and more particularly, to a digital television (DTV) transmitter and a method of coding data in the DTV transmitter. Although the present invention is suitable for a wide scope of applications, it is particularly suitable for modulating a digital television signal to a vestigial side band (VSB) mode and transmitting and receiving the VSB modulated digital television signal.

2. Discussion of the Related Art

Since the second half of 1998, the United States of America has adopted an advanced television systems committee (ATSC) 8T-VSB transmission method as the 1995 standard for broadcasting. Presently, the Republic of Korea is also providing broadcast programs by adopting the ATSC 8T-VSB transmission method as the standard for broadcasting. Accordingly, experimental broadcasting began in May 1995, and a test-broadcasting system began on Aug. 31, 2000.

FIG. 1 illustrates a conventional ATSC 8T-VSB transmitting system. A data randomizer randomizes MPEG video/audio data that are inputted. A Reed-Solomon (RS) encoder RS-codes data so as to add a 20-byte parity code. A data interleaver interleaves the data. A trellis encoder converts the data from bytes to symbols and, then, trellis-encodes the converted data. A multiplexer (MUX) multiplexes a symbol column and synchronization signals, and a pilot inserter adds a pilot signal to the symbol column. A VSB modulator converts the symbol column to an 8VSB signal of an intermediate frequency bandwidth. And, a radio frequency (RF) converter converts the VSB-converted signal to a RF bandwidth signal and transmits the RF bandwidth-converted signal to an antenna.

The 8T-VSB transmission mode, which is adopted as the standard for digital broadcasting in North America and the Republic of Korea, is a system that has been developed for the transmission of MPEG video/audio data. However, presently, the technology for processing digital signals is being developed at a vast rate, and, as a larger number of the population uses the Internet, digital electric appliances, computers, and the Internet are being integrated. Therefore, in order to meet with the various requirements of the users, a system that can add video/audio data through a digital television channel so as to transmit diverse supplemental information needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the MPEG video/audio data. However, with the advent of digital broadcasting, ATSC VSB digital television receivers that receive only MPEG video/audio data are already supplied to the market. Therefore, the supplemental data that are transmitted through the same channel as the MPEG video/audio data should not influence the conventional ATSC VSB receivers that are provided in the market. In other words, this may be defined as ATSC VSB compatibility, and the supplemental data broadcast system should be compatible with the ATSC VSB system. Herein, the supplemental data may also be referred to as enhanced data or E-VSB data. Furthermore, in a poor channel environment, the receiving quality of the conventional ATSC VSB receiving system may be deteriorated. More specifically, resistance to changes in channels and noise is more highly required when using portable and/or mobile receivers.

SUMMARY OF THE INVENTION

Accordingly, the present invention is directed to a digital television (DTV) transmitter and a method of coding data in the DTV transmitter that substantially obviate one or more problems due to limitations and disadvantages of the related art.

An object of the present invention is to provide a digital television transmitter that is suitable for transmitting supplemental data and that is highly resistant to noise.

Another object of the present invention is to provide a digital television system that can enhance a decoding function of a supplemental data symbol.

A further object of the present invention is to provide a digital television (DTV) transmitter and a method of coding data in the DTV transmitter that can insert known data in a specific area of the supplemental data and transmitting the data to a transmitter/receiver, thereby enhancing the receiving quality of the digital television system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for coding main and enhanced data for transmission includes a pre-processor for pre-processing the enhanced data by coding the enhanced data for forward error correction (FEC) and expanding the FEC-coded enhanced data, a data formatter for generating enhanced data packets including the pre-processed enhanced data and inserting known data to at least one of the enhanced data packets, a first multiplexer for multiplexing main data packets with the enhanced data packets, a data randomizer for randomizing the multiplexed data packets, a Reed-Solomon (RS) encoder for RS-coding the randomized data packets by adding first parity data, a data interleaver for interleaving the RS-coded data packets, and a trellis encoder for trellis-encoding the interleaved data packets, the trellis encoder being initialized when a known data sequence is inputted to the trellis encoder. Herein, the trellis encoder may be initialized such that an output of the trellis encoder has a known data pattern when the known data sequence is inputted to the trellis encoder.

The DTV transmitter may further include an initialization controller for generating initialization data bits required to initialize the trellis encoder, and a second multiplexer for replacing a portion of the known data sequence with the initialization data bits, wherein the trellis encoder has one or more memories for trellis-encoding an output of the second multiplexer. Additionally, the DTV transmitter may further include a backward-compatibility processor which generates second parity data based on an enhanced data packet in which the portion of the known data sequence is replaced with the initialization data bits to reflect the replacement made by the second multiplexer. Herein, the second multiplexer may further replace the first parity data included in an enhanced data packet with the second parity data.

In another aspect of the present invention, a method of coding main and enhanced data in a digital television (DTV) transmitter includes pre-processing the enhanced data by coding the enhanced data for forward error correction (FEC) and expanding the FEC-coded enhanced data, generating enhanced data packets including the pre-processed enhanced data and inserting known data to at least one of the enhanced data packets, multiplexing main data packets with the enhanced data packets, randomizing the multiplexed data packets, Reed-Solomon (RS)-coding the randomized data packets by adding first parity data, interleaving the RS-coded data packets, trellis-encoding the interleaved data packets using a trellis encoder, and initializing the trellis encoder when a known data sequence is inputted to the trellis encoder. Herein, the trellis encoder may be initialized such that an output of the trellis encoder has a known data pattern when the known data sequence is inputted to the trellis encoder.

The initializing the trellis encoder includes generating initialization data bits required to initialize the trellis encoder, replacing a portion of the known data sequence with the initialization data bits, and inputting the known data sequence including the initialization data bits into the trellis encoder. Herein, the initializing the trellis encoder may further include generating second parity data based on an enhanced data packet in which the portion of the known data sequence is replaced with the initialization data bits. The method may further include replacing the first parity data included in an enhanced data packet with the second parity data.

In another aspect of the present invention, a digital television (DTV) receiver includes a tuner for receiving a DTV signal having main data and enhanced data from a DTV transmitter, the enhanced data being coded for forward error correction (FEC) and expanded by the DTV transmitter, a demodulator for demodulating the DTV signal by performing carrier and timing recovery, an equalizer for compensating channel distortion included in the demodulated DTV signal, and a data detector for detecting one or more known data sequences from the demodulated DTV signal, wherein the demodulator and the equalizer use the detected known data sequences when performing the carrier and timing recovery and the channel distortion compensation, respectively.

In a further aspect of the present invention, a method of decoding a signal in a digital television (DTV) receiver includes receiving a DTV signal having main data and enhanced data from a DTV transmitter, the enhanced data being coded for forward error correction (FEC) and expanded by the DTV transmitter, demodulating the DTV signal by performing carrier and timing recovery, compensating channel distortion included in the demodulated DTV signal, and detecting one or more known data sequences from the demodulated DTV signal, wherein the signal modulation and channel distortion compensation of the DTV signal are performed using the detected known data sequences.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitter and the receiver. Furthermore, the main data consist of data that can be received from the conventional receiving system, wherein the main data include video/audio data.

Figure 2:
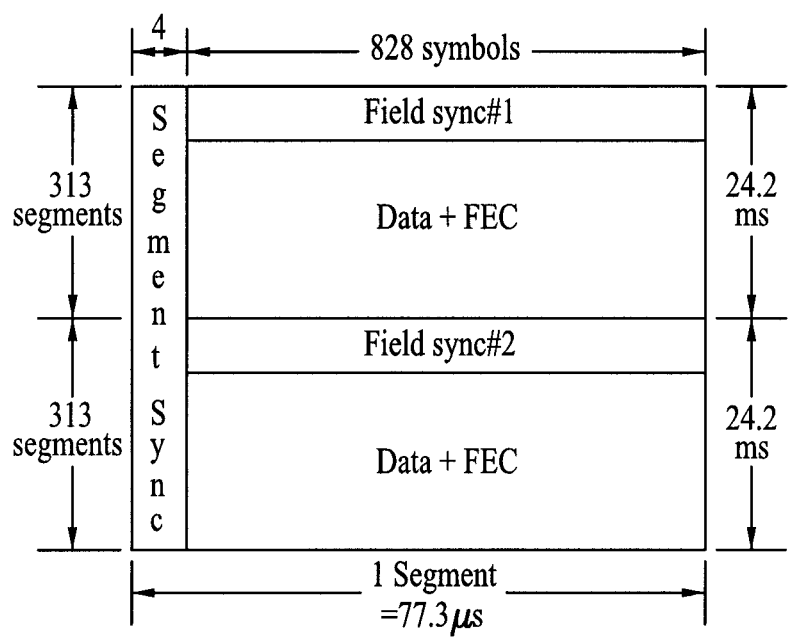
FIG. 2 illustrates a structure of a general VSB transmission frame.

FIG. 2 illustrates a structure of a general VSB transmission frame. Herein, one frame is configured of two fields. Each field includes one field synchronization segment and 312 data segments. The present invention relates to inserting known data in a predefined position within the data segment and transmitting the data, thereby enhancing the receiving quality of the receiver.

Figure 3:
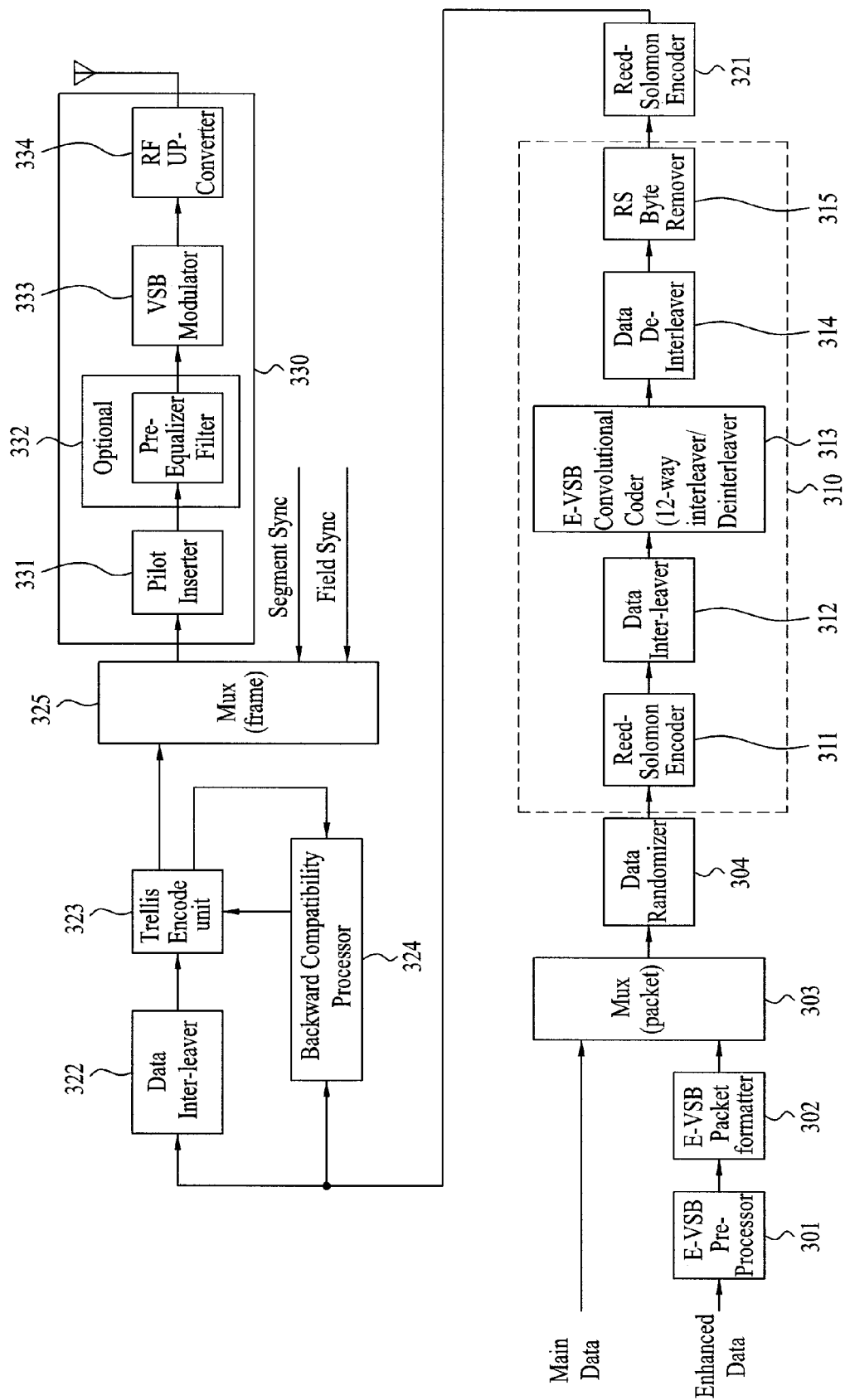
FIG. 3 illustrates an overall block view of a digital television transmitter according to the present invention.

FIG. 3 illustrates an overall block view of a digital television transmitter according to the present invention. The digital television transmitter includes an E-VSB pre-processor 301, an E-VSB packet formatter 302, a packet multiplexer 303, a data randomizer 304, an E-VSB post-processor 310, a Reed-Solomon (RS) encoder 321, a data interleaver 322, a trellis encoder 323, a backward-compatibility processor 324, a frame multiplexer 325, and a transmitter 330. In the present invention having the above-described structure, a main data is outputted to the packet multiplexer 303, and an enhanced data is outputted to the E-VSB pre-processor 301. The E-VSB pre-processor 301 pre-processes the enhanced data, such as encoding additional forward error correction (FEC) and inserting null data bits, and then outputs the pre-processed enhanced data to the E-VSB packet formatter 302.

The E-VSB packet formatter 302 aligns the pre-processed data and the pre-defined known data on a specific position of the packet in accordance with a set rule. Thereafter, the E-VSB packet formatter 302 outputs the aligned data to the packet multiplexer 303 in even packet units. The detailed operation of the E-VSB packet formatter 302 will be described in a later process. Furthermore, the packet multiplexer 303 multiplexes the enhanced MPEG packet and the main MPEG packet in accordance with a pre-defined multiplexing rule, the enhanced MPEG packet having the known data inserted therein and transmitted from the E-VSB packet formatter 302. Then, the multiplexed data passes through the data randomizer 304 and is outputted to the E-VSB post-processor 310. Herein, the E-VSB post-processor 310 includes a Reed-Solomon (RS) encoder 311, a data interleaver 312, an E-VSB convolutional encoder 313, a data deinterleaver 314, and a RS byte remover 315. The RS encoder 311 RS-codes the data outputted from the data randomizer 304. Thereafter, the RS encoder 311 adds 20-byte parity data and outputs the data to the data interleaver 312.

Figure 4:
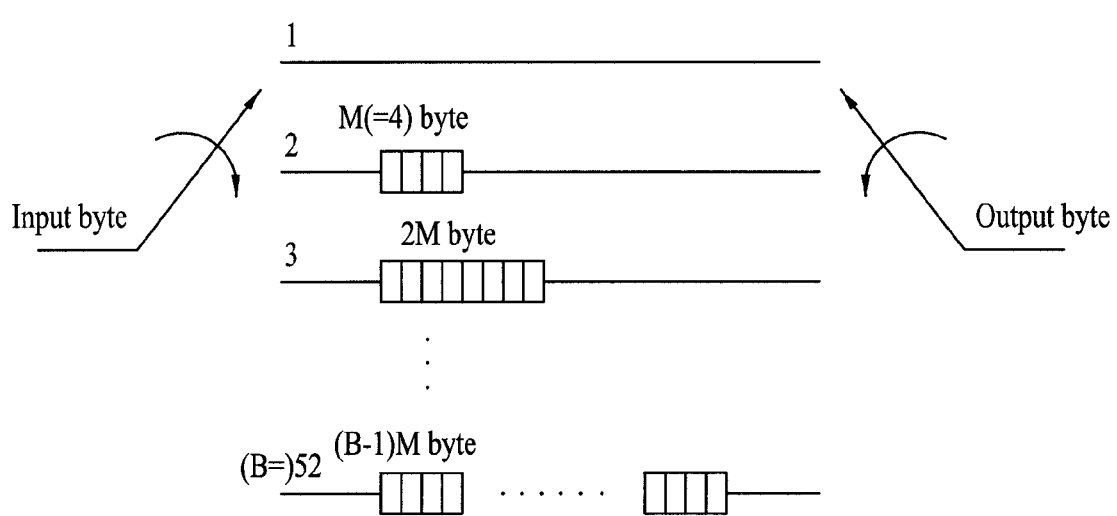
FIG. 4 illustrates a block view of a data interleaver shown in FIG. 3 according to an embodiment of the present invention.

FIG. 4 illustrates a block view of the data interleaver 312, shown in FIG. 3, according to an embodiment of the present invention. In this example, a convolutional interleaver having 52 branches and a unit memory byte number of M=4 is described. In the data interleaver 312, when a first byte is inputted, the inputted first byte is directly outputted through a first branch, and a second byte is inputted through a second branch. Accordingly, a value prior to 52*4 bytes (i.e., (B−1)M bytes, wherein B=52 and M=4) is outputted.

Figure 5:
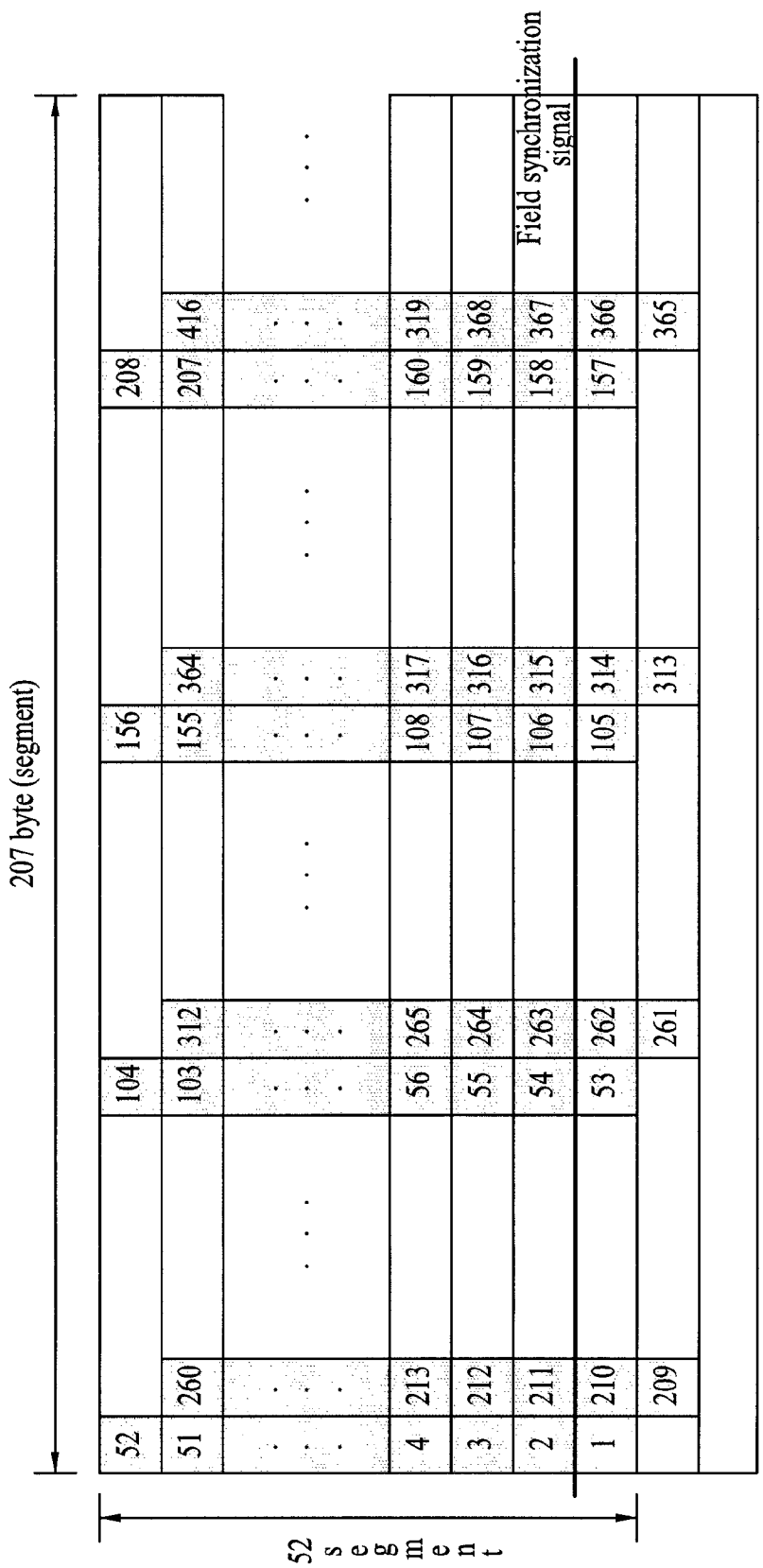
FIG. 5 illustrates an operation example of the data interleaver shown in FIG. 3 on the frame according to the present invention.

FIG. 5 illustrates an operation example of the data interleaver shown in FIG. 3 on the frame according to the present invention. Herein, the data is inputted in segment units from top to bottom, and the byte within the segment is inputted first to the left side and then to the right side. The numbers shown in FIG. 5 indicate the outputted order from the interleaver. The data interleaver 312 is operated in units of 52 segments. The output data of the data interleaver 312 are outputted to the E-VSB convolutional encoder 313. Then, the E-VSB convolutional-encoded data pass through the data de-interleaver 314 and are outputted to the RS byte remover 315, thereby removing (or deleting) the 20-byte parity data. This is to recalculate the parity data since the original data have been modified by the E-VSB convolutional encoder 313.

Herein, the E-VSB convolutional encoder 313 converts the inputted bytes to symbols. Thereafter, E-VSB convolutional-encoding is performed only on the enhanced data symbols, which are then converted back to bytes from symbols so as to be outputted. More specifically, the E-VSB convolutional encoder 313 outputs data without modifying the data when the output of the data interleaver 312 is the main data, or when the output of the data interleaver 312 is the known data that were inserted in the enhanced data packet. Further, the E-VSB convolutional encoder 313 also outputs the MPEG header byte added by the E-VSB packet formatter and the RS parity byte added to the enhanced data packet by the RS encoder 311 without modifying the corresponding data. In other words, the output of the RS byte remover 315 is inputted to the RS encoder 321 so as to be RS-coded. Then, after the 20-byte parity data are added once again, the data are outputted to the data interleaver 322. The operation of the data interleaver 322 can be easily understood by referring to FIG. 3 and FIG. 4. Therefore, a detailed description of the same will be omitted for simplicity.

The output of the data interleaver 322 is inputted to the trellis encoder 323. The trellis encoder 323 trellis-encodes the inputted 2 bits to 3 bits and outputs the trellis-encoded data (i.e., 3 bits) to the frame multiplexer 325. In order to make the data outputted from the trellis encoder 323 as the known data defined from the transmitting/receiving ends, a memory within the trellis encoder 323 needs to be initialized with respect to the known data inserted in the E-VSB packet. At this point, initialization is performed by a new set of data and not by the input data. Therefore, a new set of RS parity data should be calculated and be replaced with the initial parity data. More specifically, this operation is performed by the backward-compatibility processor 324. The initialization process of the trellis encoder 323 and the operation of the backward-compatibility processor 324 will also be described in detail in a later process.

Figure 1:
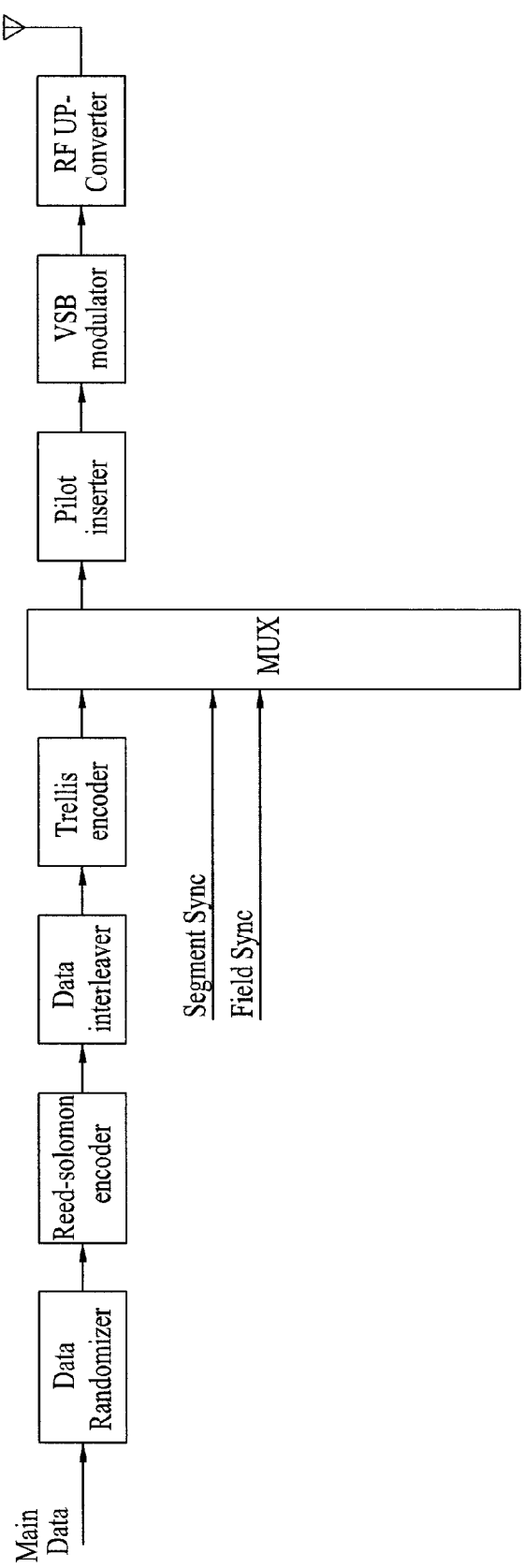
FIG. 1 illustrates a block view of a conventional ATSC 8T-VSB transmitting system.

The output of the trellis encoder 323 is inputted to the frame multiplexer 325. Then, the frame multiplexer 325 inserts field and segment synchronization signals to the output data of the trellis encoder 323 and outputs the data to the transmitter 330. The transmitter 330 includes a pilot inserter 331, a VSB modulator 333, and a radio frequency (RF) converter 334. Since this structure is similar to the digital television transmitter of FIG. 1, a detailed description of the same will be omitted for simplicity.

Figure 6:
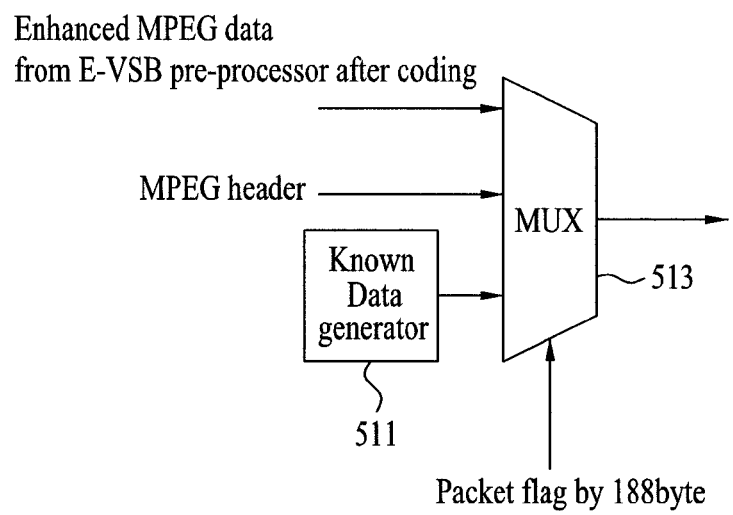
FIG. 6 illustrates a detailed block view of a packet formatter shown in FIG. 3 according to an embodiment of the present invention.

Hereinafter, the operation of the packet formatter 302 will be described in detail. FIG. 6 illustrates a detailed block view of the packet formatter shown in FIG. 3 according to an embodiment of the present invention. The packet formatter 302 includes a known data generator 511 and a multiplexer 513. The known data generator 511 creates the known data, and the multiplexer 513 multiplexes and outputs the data pre-processed by the E-VSB pre-processor 301 and the MPEG header byte. More specifically, the multiplexed and outputted known data are interleaved and trellis-encoded from the transmitting end, thereby being transmitted to the receiving end. In the VSB transmission frame structure of the receiving end, the frame structure being the last step prior to the final transmission, the transmitted data is used as a separate reference data other than the synchronization data in a channel equalizer and a demodulator. Herein, in the related art receiver only the synchronization data was used as the reference data. Thus, the receiving quality can be enhanced. Additionally, the output of the packet formatter 302 is outputted in 188-byte units. The first 4 bytes correspond to the MPEG header byte. And, the known data and the output data of the E-VSB pre-processor are multiplexed in the remaining 184 bytes.

Figure 7:
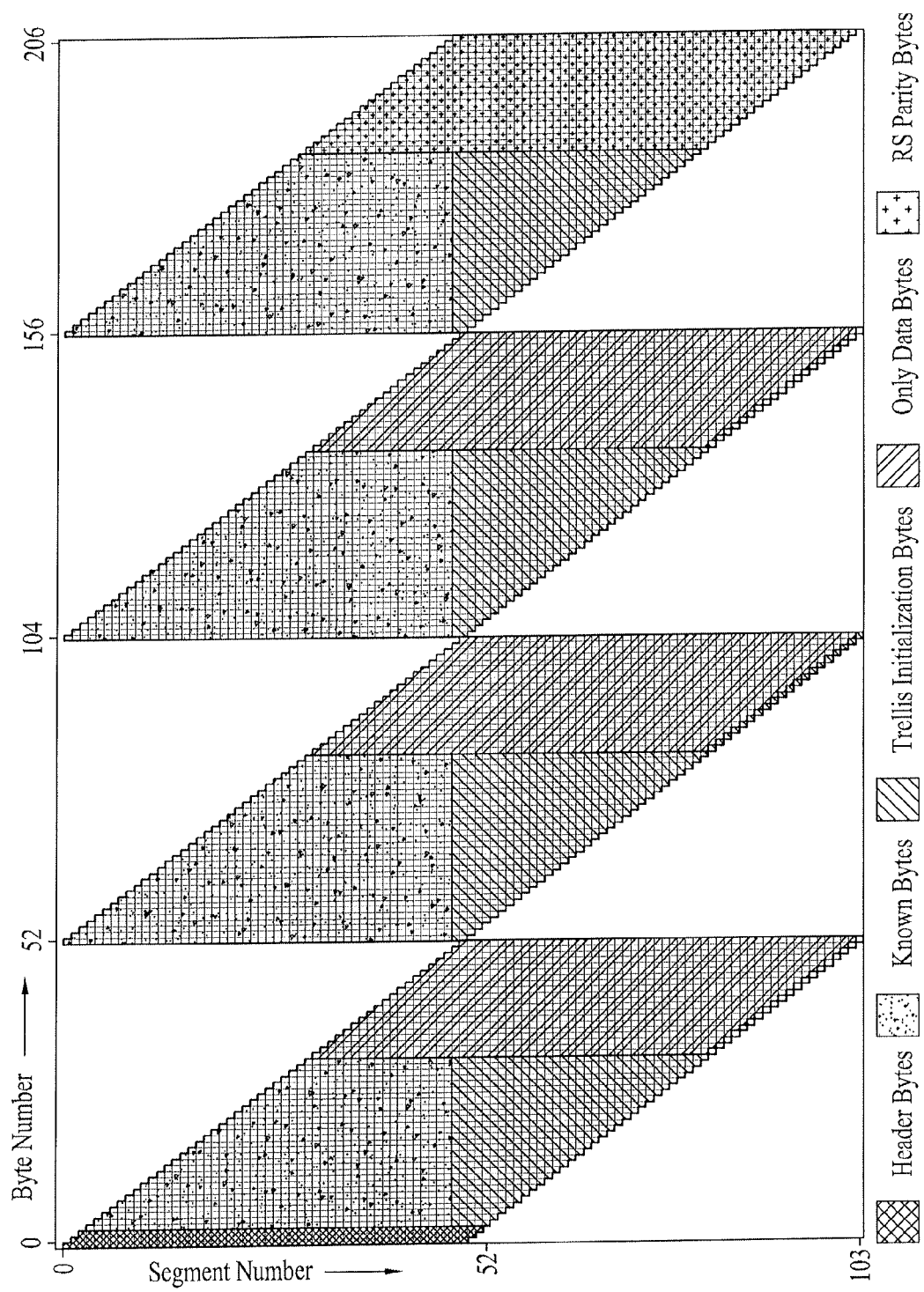
FIG. 7 illustrates a frame structure showing an example of inserting known data prior to interleaving according to the present invention.

FIG. 7 illustrates a frame structure showing an example of inserting a known data sequence prior to interleaving according to the present invention. However, this does not correspond to the final frame that is to be transmitted. In other words, FIG. 7 illustrates a portion of the data segments within the frame and, more specifically, illustrates an example of the known data sequence being inserted by the packet formatter 302. For a better understanding and simplicity of the description of the present invention, the frame structure shown in the example of FIG. 7 consists of 52 segments, which corresponds to an interleaving depth. In the ATSC VSB system, the packet of the inputting end of the data interleaver 312 is also referred to as a data segment.

Referring to FIG. 7, the frame structure broadly consists of 4 data areas. More specifically, the frame structure consists of a header area 701, a payload area 702 in which only the E-VSB data can be present, a parity area 703, and a known data area 704 in which the known data sequence can be present. Herein, the known data area is divided into a first area 705 in which the trellis encoder can be initialized, and a second area 706 in which the trellis encoder cannot be initialized.

The first area 705 in which the trellis encoder can be initialized corresponds to a position of the bytes that are outputted from the data interleaver earlier than the parity bytes of the corresponding segment. At this point, when the data being inputted to the trellis encoder 323 corresponds to the beginning of the known data sequence, or when the inputted data is changed from the E-VSB data to the known data sequence, a portion or all of the data in the first area 705 is replaced with initialized data and inputted to the memory of the trellis encoder 323. A portion of all of the first area 705 in which the trellis encoder can be initialized may include the known data sequence and/or the E-VSB data.

The second area 706 in which the trellis encoder cannot be initialized may include the known data sequence or the general E-VSB data. Herein, the area size of both data types may be adequately modified by the designer of the present invention. In other words, the amount of the known data (or size of the known data sequence) and that of the E-VSB data is relative to one another. Furthermore, the size of the first area 705 and the size of the second area 705 may differ in each segment.

Figure 8:
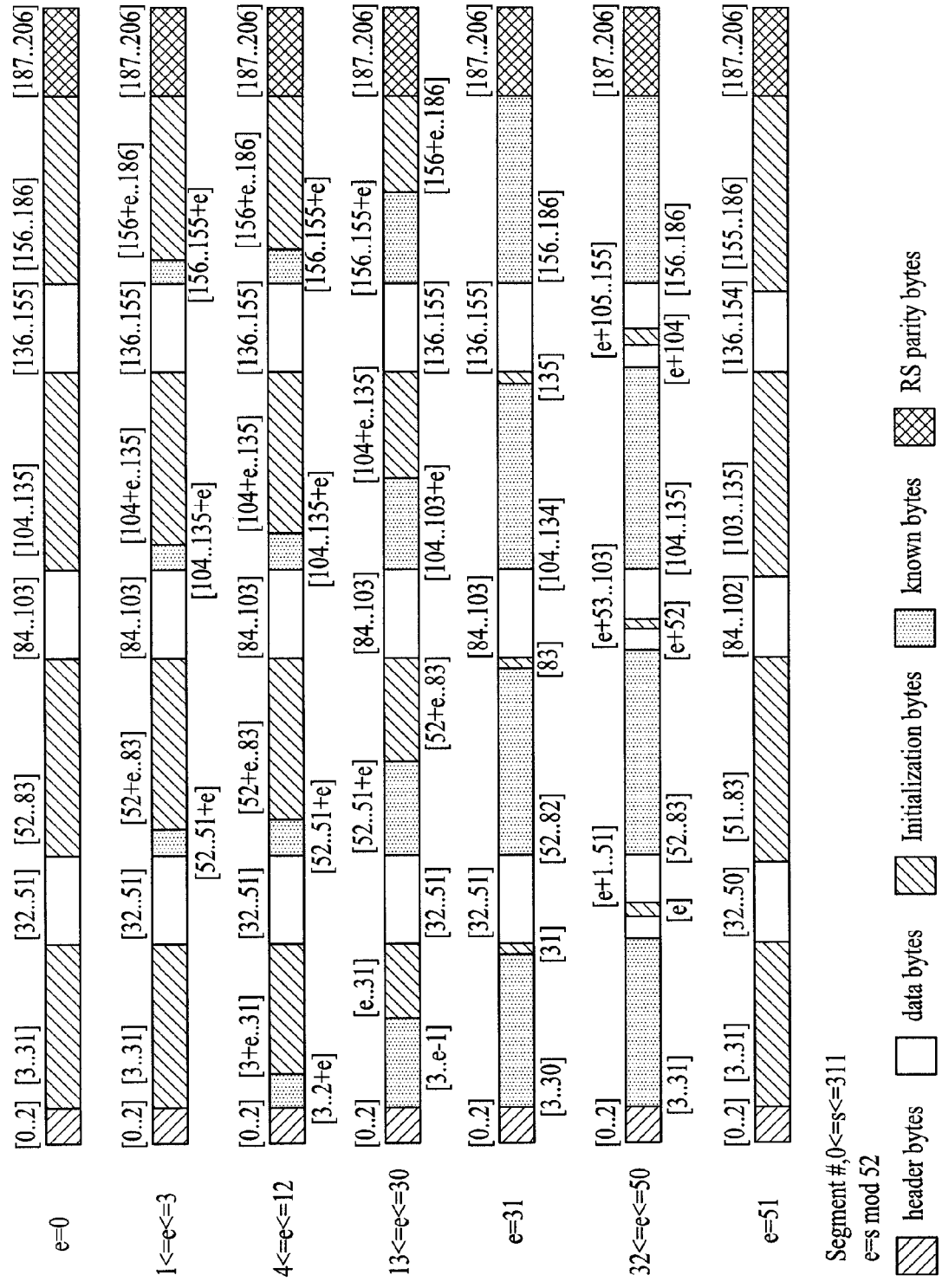
FIG. 8 illustrates the example of inserting known data by describing each corresponding segment.

In the example shown in the preferred embodiment of the present invention, the size of each area differs in accordance with a segment order within a VSB data field. FIG. 8 illustrates the example of inserting known data by describing each corresponding segment. This is to enable, after a data interleaving process, the known data of each segment to be gathered (or grouped) in a specific area. For example, when the interleaving depth of a segment is 52, and when the order (e) of the segment is equal to or higher than and equal to or lower than 30 (i.e., 13≦e≦30), the segment sequentially includes a header area, an area in which the trellis encoder cannot be initialized, an area in which the trellis encoder can be initial-ized, and a payload area. This order is repeated 4 times, and thereafter, a parity area is included.

Figure 9:
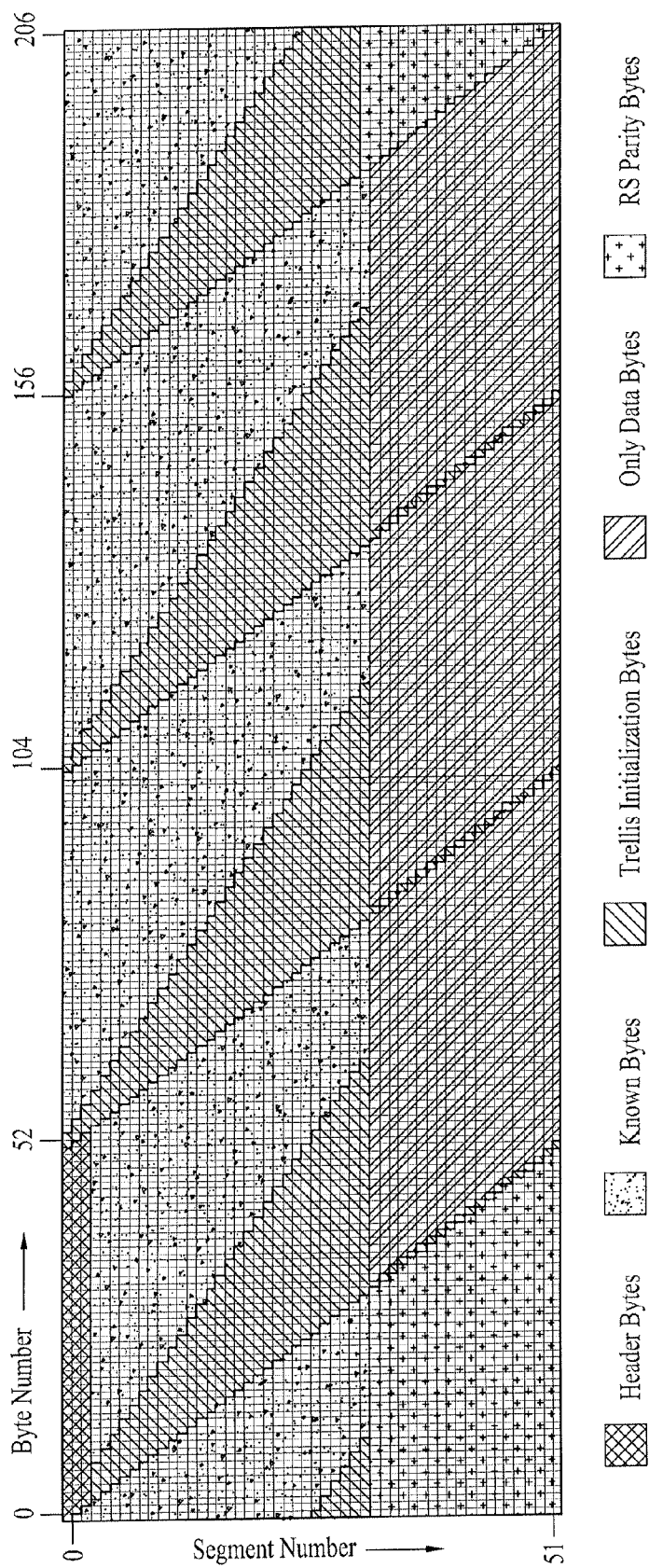
FIG. 9 illustrates a frame structure showing an example of inserting known data after interleaving according to the present invention.

When data is interleaved in the above-described structure by the data interleaver 322, the corresponding frame structure is as shown in FIG. 9. More specifically, FIG. 9 illustrates a frame structure showing an example of inserting known data sequence after interleaving according to the present invention. Referring to FIG. 9, the data of the header areas are first included, and then the data of the known data areas are included. In other words, the known data which were scattered in each segment prior to the data interleaving process are grouped in a plurality of segments after the data interleaving process. The known data areas are followed by data of the parity areas and the data of the payload areas.

Figure 10:
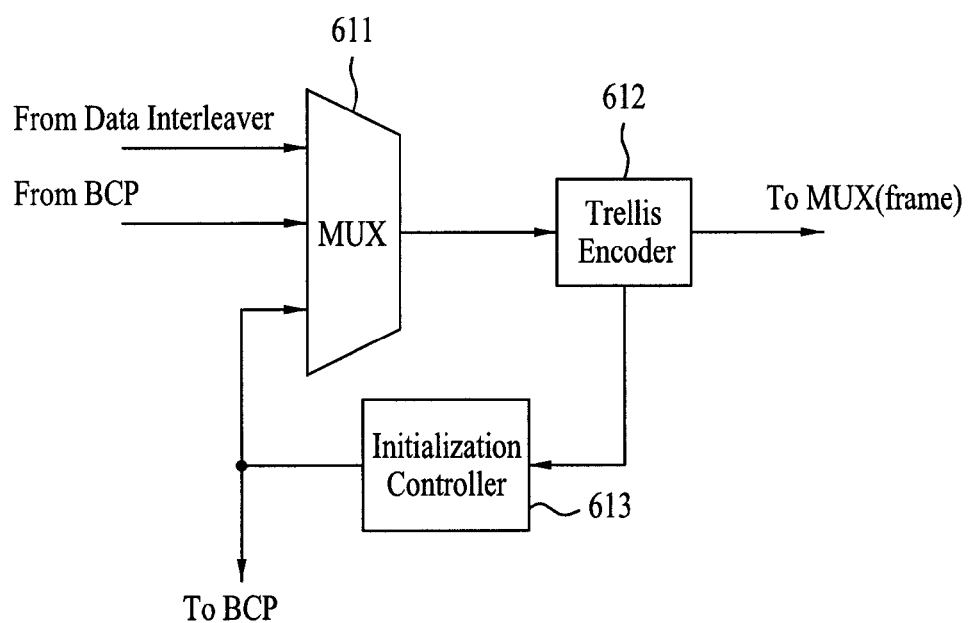
FIG. 10 illustrates a detailed block view of a trellis encoder according to an embodiment of the present invention.

FIG. 10 illustrates a detailed block view of a trellis encoder according to an embodiment of the present invention. More specifically, FIG. 10 is an example of a detailed block view of the trellis encoder 323 that can be initialized and that trellis-encodes the data interleaved by the data interleaver as shown in FIG. 9. Referring to FIG. 10, the trellis encoder 323 includes a multiplexer 611, a trellis encoder 612, and an initialization controller 613. The multiplexer 611 multiplexes and outputs the interleaved data, the parity bytes outputted from the backward-compatibility processor 324, and the initialization data bits in accordance with a predetermined rule. The initialization controller 613 generates initialization data bits for initializing the memory of the trellis encoder 612, so as to output the generated initialization data bits to the multiplexer 611 and the backward-compatibility processor 324.

More specifically, when the interleaved data are the known data, and the known data are positioned at the beginning of the known data sequence, to which data is consecutively inputted, then initialization of the trellis encoder 323 is required. After the trellis initialization, an output sequence of the trellis encoder is still known when an input sequence of the trellis encoder is known. Furthermore, when the memory of the trellis encoder 612 is required to be initialized, a portion of the known data sequence should be replaced with the initialization data bits and outputted to the trellis encoder 612. Accordingly, the memory of the trellis encoder 612 is initialized by the initialization data bits, and the output of the trellis encoder 612 includes the known data sequence coded with a pattern desired by the transmitter/receiver.

On the other hand, when the interleaved and outputted data is the known data, and when initialization is required, the multiplexer 611 replaces a portion of the interleaved data with the initialization data bits and outputs the data to the trellis encoder 612. Additionally, on the parity position within each segment, the parity data outputted from the backward-compatibility processor 324 is outputted to the trellis encoder 612. Thereafter, the trellis encoder 612 trellis-encodes the data outputted from the multiplexer 611 by symbol units. In other words, the trellis encoder 612 uses a memory to encode and output an upper bit to 1 bit, wherein the upper bit configures one symbol, and uses 2 memories to encode and output a lower bit to 2 bits. Herein, when the known data is inputted, the memories should be initialized so that the desired known data sequence can be outputted after being trellis-encoded.

When the initialization of the memories is required, the initialization controller 613 verifies the status of the memory and generates the initialization data bits accordingly, thereby outputting the generated initialization data bits to the multiplexer 611. The initialization data bits consist of 4 bits, i.e., 2 symbols. 12 trellis encoders are included in this structure. Each of the 12 bytes being outputted from the multiplexer 613 is sequentially and respectively inputted to each trellis encoder. Herein, initial 4 bits (i.e., 2 symbols) of each byte may become the initialization data bits.

The initialization controller 613 outputs the initialization data bits to the backward-compatibility processor 324. More specifically, since the memory is initialized by a new set of data and not by the interleaved data, the RS parity data should be newly calculated and replaced with the original (or initial) parity data. This operation is performed by the backward-compatibility processor 324. Herein, the backward-compatibility processor 324 receives the output of the RS encoder 321 and the output of the initialization controller 613 within the trellis encoder 323, thereby re-calculating 20-byte parity data and outputting the re-calculated parity data to the multiplexer 611. The output of the trellis encoder 323 is outputted to the frame multiplexer 325. Thereafter, the frame multiplexer 325 inserts field and segment synchronization signals to the output data of the trellis encoder 323, which is then transmitted through the transmitter 330.

Figure 11:
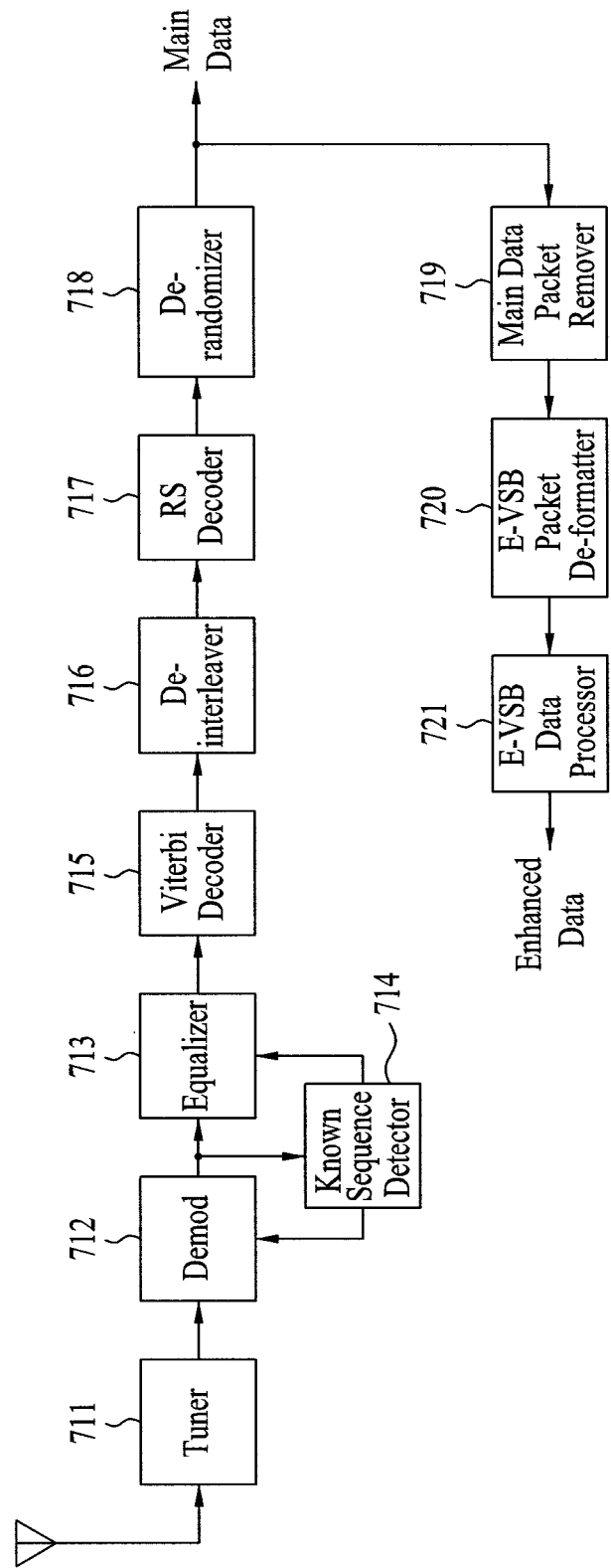
FIG. 11 illustrates a block view showing an overall structure of the digital television receiver according to an embodiment of the present invention.

FIG. 11 illustrates a block view showing an overall structure of the digital television receiver according to an embodiment of the present invention. More specifically, FIG. 11 illustrates an example of a DTV receiver that receives data transmitted from the VSB transmitting system, shown in FIG. 3, and that demodulates and equalizes the received data so as to restore (or recover) the transmitted data. The DTV receiver includes a tuner 711, a demodulator 712, an equalizer 713, a known data (or sequence) detector 714, a Viterbi decoder 715, a deinterleaver 716, a Reed-Solomon (RS) decoder 717, and a derandomizer 718. The DTV receiver also includes a main data packet remover 719, a packet deformatter 720, and an E-VSB data processor 721.

The tuner 711 tunes the frequency of a particular channel. Subsequently, the tuner 711 down-converts the tuned frequency and outputs the tuned channel frequency to the demodulator 712. The demodulator 712 demodulates the tuned channel frequency in an inverse method of the transmission method, thereby outputting the corresponding data to the equalizer 713 and the known data for sequence) detector 704. Herein, for example, the demodulator 712 performs carrier recovery, symbol timing recovery and so on. The equalizer 713 performs compensation for any channel distortion included in the demodulated signal. The equalizer 713 then outputs the processed signal to the Viterbi decoder 715.

At this point, the known data detector 704 detects the known data sequence, which has been inserted by the transmitting end, from the output data of the demodulator 712. Then, the known data detector 704 outputs the detected known data to the demodulator 712 and the equalizer 713. When the demodulator 712 uses the known data during the timing recovery or the carrier recovery, the demodulating performance may be enhanced. Similarly, when the equalizer 713 uses the known data for channel compensation, the equalization performance may be enhanced.

The output of the equalizer 713 passes through the Viterbi decoder 715, the deinterleaver 716, the RS decoder 717, and the derandomizer 718. Thereafter, the output data are outputted to a main MPEG decoder (not shown) and simultaneously outputted to the main packet remover 719. Herein, the main MPEG decoder only decodes the packet(s) corresponding to the main MPEG. If the packet ID is 'E-VSB', then the main MPEG decoder does not perform the decoding operation. In the meantime, the main data packet remover 719 removes the main data packet from the data outputted from the derandomizer 718 and outputs the data to the E-VSB packet deformatter 720. Subsequently, the E-VSB packet deformatter 720 removes (or deletes) the MPEG header from the signal outputted from the main data packet remover 719. And the E-VSB packet deformatter 720 removes the known data sequence included in the signal removed the MPEG header and, then, outputs the signal to the E-VSB data processor 721.

As described above, the digital television (DTV) transmitter and the method of coding data in the DTV transmitter according to the present invention have the following advantages. More specifically, the DTV transmitter is highly protected against (or resistant to) any error that may occur when transmitting supplemental data through a channel, and the DTV transmitter is also highly compatible to the conventional VSB system. The present invention may also receive the supplemental data without any error even in channels having severe ghost effect and noise. Additionally, by inserting known data sequence in a specific area of the data area and transmitting the processed data, the receiving performance of the digital television receiver liable to a frequent change in channel may be enhanced. Finally, the present invention is more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transmitter for transmitting enhanced data, the transmitter comprising:
   a processor for processing the enhanced data, the processor comprising:
      a first encoder for encoding the enhanced data for forward error correction (FEC) using a Reed-Solomon (RS) method;
      a second encoder for convolutional-coding the encoded enhanced data to symbols, interleaving the symbols and converting the interleaved symbols to bytes; and
      a data de-interleaver for de-interleaving the bytes outputted from the second encoder to output de-interleaved data;
   a third encoder for RS encoding the de-interleaved data by adding RS parity data to the de-interleaved data;
   a data interleaver for interleaving the RS encoded data;
   a trellis encoder for trellis encoding the interleaved data; and
   a transmitter for transmitting the trellis-encoded data,
   wherein the trellis-encoded data have a data structure,
   wherein the data structure includes data segments, each of the data segments comprising 207 bytes,
   wherein a known data sequence is included in N bytes in a K-th data segment and in M bytes in a (K+1)th data segment of the data structure,
   wherein the trellis encoder includes a multiplexer for selecting an initialization bit when a start bit of the known data sequence is inputted to the trellis encoder,
   wherein MPEG header bytes are included in L bytes in a J-th data segment of the data structure,
   wherein J, K, L, M and N are natural numbers,
   wherein L is smaller than N or M, and
   wherein N is not equal to M.

2. The transmitter of claim 1, further comprising:
   a multiplexer for inserting segment sync data and field sync data to the data structure.

3. The transmitter of claim 2, further comprising:
   a pilot inserter for inserting pilot signals into the data structure;

a modulator for converting the data structure into intermediate frequency (IF) signals; and a radio frequency (RF) converter for converting the IF signals into RF signals for transmission.

4. The transmitter of claim 1, further comprising:

a backward-compatibility processor for replacing the added RS parity data with RS parity data for the initialization bit.

5. A method of transmitting enhanced data, the method comprising:

processing, at a processor, the enhanced data, wherein processing the enhanced data comprises:

encoding the enhanced data for forward error correction (FEC) using a Reed-Solomon (RS) method;

convolutional coding the encoded enhanced data to symbols;

interleaving the symbols;

converting the interleaved symbols to bytes; and de-interleaving the bytes to output de-interleaved data;

RS encoding, at an RS encoder, the de-interleaved data by adding RS parity data to the de-interleaved data;

interleaving, at an interleaver, the RS encoded data;

trellis encoding, at a trellis encoder, the interleaved data; and transmitting, at a transmitter, the trellis-encoded data, wherein the trellis-encoded data have a data structure, wherein the data structure includes data segments, each of the data segments comprising 207 bytes, wherein a known data sequence is included in N bytes in a K-th data segment and in M bytes in a (K+1)th data segment of the data structure, wherein trellis encoding the interleaved data comprises selecting an initialization bit when a start bit of the known data sequence is inputted to a trellis encoder, wherein MPEG header bytes are included in L bytes in a J-th data segment of the data structure, wherein J, K, L, M and N are natural numbers, wherein L is smaller than N or M, and wherein N is not equal to M.

6. The method of claim 5, further comprising:

inserting segment sync data and field sync data to the data structure.

7. The method of claim 6, further comprising:

inserting pilot signals into the data structure;

converting the data structure into intermediate frequency (IF) signals; and converting the IF signals into radio frequency (RF) signals for transmission.

8. The method of claim 5, further comprising:

replacing the added RS parity data with RS parity data for the initialization bit in order to ensure backward-compatibility.

* * * * *